United States Patent [19]

Cole et al.

[11] Patent Number: 6,028,484
[45] Date of Patent: Feb. 22, 2000

[54] ULTRASOUND APPARATUS AND METHOD FOR AMPLIFYING TRANSMIT SIGNALS

[75] Inventors: Christopher R. Cole, Redwood City; Laurence J. Newell, Saratoga, both of Calif.

[73] Assignee: Acuson Corporation, Mountain View, Calif.

[21] Appl. No.: 09/021,083

[22] Filed: Feb. 10, 1998

[51] Int. Cl.[7] ............................... H03F 3/68; H03F 3/04; H03F 3/45
[52] U.S. Cl. .......................... 330/295; 330/5.5; 330/254
[58] Field of Search ............................... 330/124 R, 295, 330/254, 5.5, 73; 381/120, 77, 79

[56] References Cited

U.S. PATENT DOCUMENTS

| | | | |
|---|---|---|---|
| 4,593,251 | 6/1986 | Smith | 330/124 R |
| 5,438,684 | 8/1995 | Schwent et al. | 330/295 |
| 5,548,246 | 8/1996 | Yamamoto et al. | 330/295 |
| 5,675,554 | 10/1997 | Cole et al. | |
| 5,694,937 | 12/1997 | Kamiyama | |

*Primary Examiner*—Robert Pascal
*Assistant Examiner*—Patricia T. Nguyen
*Attorney, Agent, or Firm*—Craig A. Summerfield, Esq.; Brinks Hofer Gilson & Lione

[57] ABSTRACT

A method and system for amplifying an ultrasonic transmit signal is provided. A first amplifier stage has a first supply voltage input and receives transmit signals. A second amplifier stage has a second supply voltage input and receives transmit signals in parallel with the first amplifier stage. Amplified transmit signals are output from one of the first and second amplifier stages. The supply voltage inputs are supplied with fixed voltages. The first amplifier stage is associated with PW operation and a higher supply voltage than the second amplifier stage. The second amplifier stage is associated with CW operation.

27 Claims, 4 Drawing Sheets

ULTRASOUND APPARATUS AND METHOD FOR AMPLIFYING TRANSMIT SIGNALS

BACKGROUND

This invention relates to an ultrasound apparatus and method for amplifying transmit signals. In particular, the invention relates to amplifying pulse wave and continuous wave signals for application to a transducer element.

In ultrasound, continuous waves (CW) are associated with spectral Doppler modes of operation, and pulse waves (PW) are associated with pulsewave spectral Doppler, B-mode and Color Doppler modes of operation. Continuous waves are waves that repeat cyclically for a plurality of cycles, such as 50–100 cycles. Continuous waves provide little or no range resolution. Pulse waves provide range resolution and are associated with only a few cycles of a waveform, such as 1–2 cycles. Longer duration PW operation or shorter duration CW operation are also possible.

During PW or CW operation, a plurality of transmit waveforms are applied to a respective plurality of transducer elements. Each transducer element is associated with a channel or a processing path for generating the transmit waveform.

Many ultrasound systems are capable of both CW and PW operation. These systems include analog or digital structures for generating appropriate waveforms (PW or CW). For example and as disclosed in U.S. Pat. No. 5,675,554 (the '554 patent), the disclosure of which is herein incorporated by reference, digital samples representing a transmit waveform are generated at a particular sample rate. The samples are converted to analog differential currents representing the transmit waveform.

Before application of the transmit waveform to a transducer element, the waveform is amplified. In particular, the transmit waveform is current and voltage amplified by current and voltage amplifiers. Regardless of CW or PW operation, the transmit waveforms are applied through the same current and voltage amplifiers. Thus, the voltage amplifier is powered from a programmable or variable power supply. The supply voltage is set as a function of the peak output voltage.

For CW operation, the supply voltage is significantly less than for PW operation. The acoustic waveform generated by the transducer element is limited by government regulation of the power generated at various points along the path of propagation. Due to the lesser duration during PW operation, the pulse waveforms may have higher peak powers (higher current and voltage). Due to the longer duration during CW operation, the continuous waveforms have lower power (lower current and voltage).

Depending on the mode of operation (CW or PW), the programmable power supply is adjusted. For example, the programmable power supply provides a voltage within a 30 to 210 volt range in selectable steps, such as 15 volt increments with finer steps in the 30–40 and 100–210 volt ranges. However, implementing a programmable power supply requires expensive hardware.

SUMMARY

The present invention is defined by the following claims, and nothing in this section should be taken as a limitation on those claims. By way of introduction, the preferred embodiment described below includes a method and system for amplifying an ultrasonic transmit signal. A first amplifier stage has a first supply voltage input and receives transmit signals. A second amplifier stage has a second supply voltage input and receives transmit signals in parallel with the first amplifier stage. Amplified transmit signals are output from one of the first and second amplifier stages.

In one embodiment, the supply voltage inputs are supplied with fixed voltages. The first amplifier stage is associated with PW operation and a higher supply voltage than the second amplifier stage. The second amplifier stage is associated with CW operation.

Further aspects and advantages of the invention are discussed below in conjunction with the preferred embodiments.

DETAILED DESCRIPTION OF PREFERRED EMBODIMENTS

Figure 1:
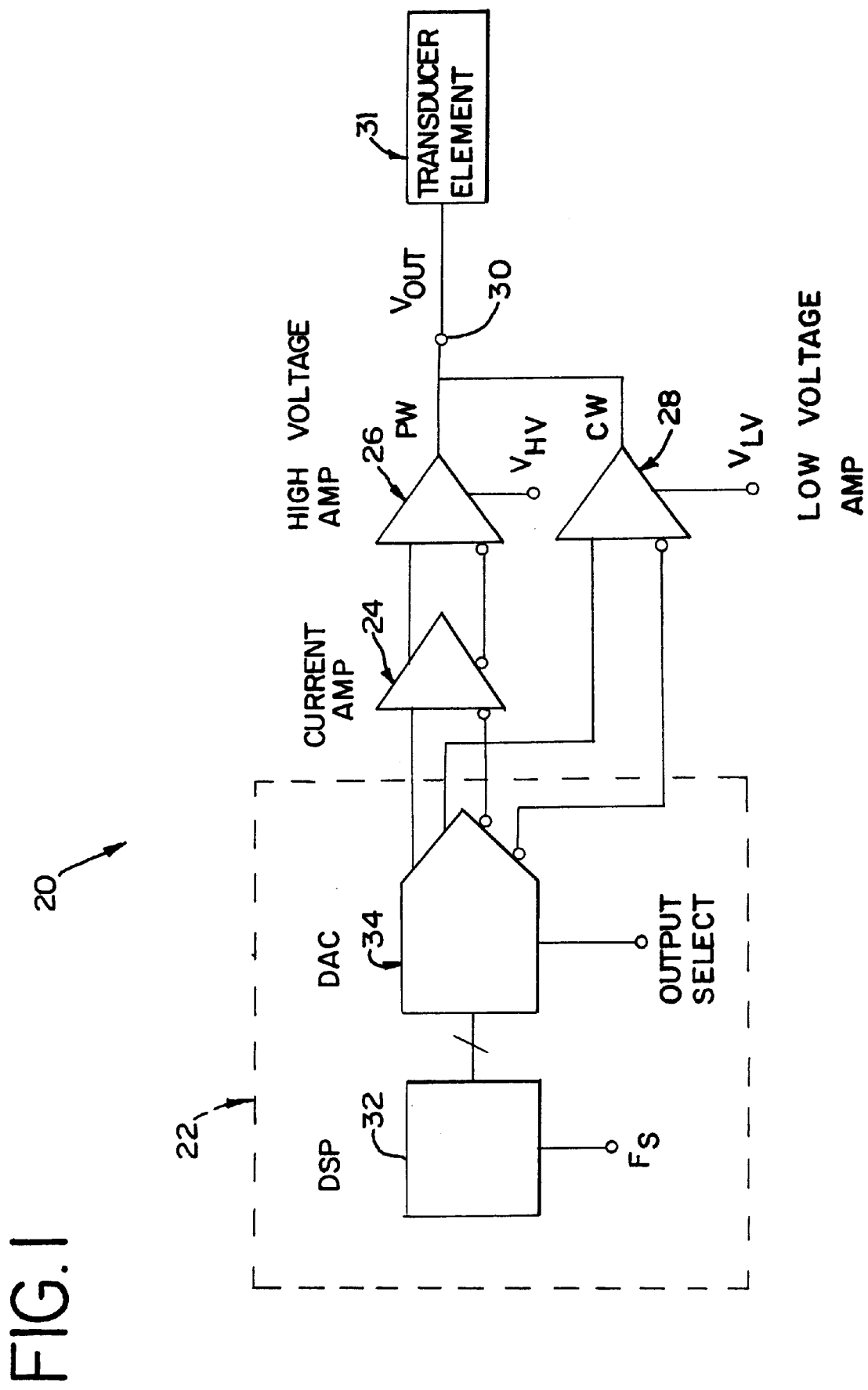
FIG. 1 is a block diagram representing an embodiment of one channel for waveform generation.

Referring to FIG. 1, one channel for generation of acoustic waveforms is generally shown at 20. The channel 20 includes ultrasound transmit signal processing circuitry 22, a current amplifier 24, a high voltage amplifier 26, a low voltage amplifier 28 and an output 30. Separate paths for amplification are provided for CW and PW operation.

The signal processing circuitry 22 includes analog or digital signal processing circuitry. Preferably, digital processing circuitry is used, such as disclosed in the '554 patent. For example, and as shown, the signal processing circuitry 22 includes a digital signal processor 32 and a digital to analog converter (DAC) 34. Based on the sample rate input, $F_s$, the digital signal processor 32 outputs digital representations of the transmit signal to the DAC 34. The DAC 34 converts the digital representation to an analog representation and outputs the analog transmit signal, such as a PW or CW signal. Other analog or digital circuitry, such as counter structures for generating a certain number of cycles, may be used.

The analog transmit signal is preferably output by the signal processing circuitry 22 as a differential current. Two unipolar signals are used to represent a bipolar signal (the positive and negative portions of the transmit signal are processed in parallel). Preferably, each unipolar signal is associated with a sinking current. Other implementations may be used, such as rising current, no differential current, or only one unipolar signal. Preferably, the signal processing circuitry 22 also outputs a DC bias. The DC bias provides voltage to operate the transistors in the amplifiers 24, 26, 28 in the linear range.

The transmit signal is output or directed either to the current amplifier 24 or to the lower voltage amplifier 28, depending on the mode of operation. During CW operation, the transmit signals are output to the low voltage amplifier 28. The low voltage amplifier 28 represents the CW amplifier stage or path. During PW operation, the transmit signals are output to the current amplifier 24. The current amplifier 24 and the high voltage amplifier 26 represent the PW amplifier stage or path. The circuitry for switching between these two outputs is integral to the DAC 34 or provided separate from the DAC 34. The CW path may also be used for long gate Doppler PW operation. Preferably, the non-selected path receives substantially no current.

During PW operation, the differential currents of the transmit signal are amplified by the current amplifier 24. The output of the current amplifier 24 is supplied to the high voltage amplifier 26. The high voltage amplifier 26 is supplied with a fixed high voltage, such as 210 volts. Preferably, the voltage supply corresponds to an available voltage supply of the ultrasound system. Other voltages may be supplied. Furthermore, the voltage supply may be variable, such as within a 100–200 volt range. Other PW amplification paths, with or without current or voltage amplificating may be used. The output of the high voltage amplifier is an amplified transmit signal and is supplied to the output 30.

During CW operation, the transmit signal is amplified by the low voltage amplifier 28. A fixed supply voltage, such as 12 or 15 volts, is supplied to the low voltage amplifier 28. Other voltages may be used, and a variable voltage, such as 15–30 volt range may also be used. The output of the low voltage amplifier is also supplied to the output 30. Preferably the supply voltage input of the low voltage amplifier 28 is connected to an existing system supply, such as 12 volt supply. Other CW amplification paths, with or without current or voltage amplifications, may be used.

To avoid affecting the operation of one amplifier stage, the output impedance of the high voltage amplifier 26 and the low voltage amplifier 28 is preferably high. For example, a 100 ohm resistor, or more preferably a 200 ohm resistor (at 2 megahertz), is placed across the differential currents between the current amplifier 24 and high voltage amplifier 26. Alternatively, the output 30 is connected to ground through a resistor. Other alternatives creating no or other levels of impedance output may also be used.

The output 30 is operatively connected to a transducer element 31. Preferably, a plurality of transducer elements 31 and associated channels 20 are used for generating acoustic waves. Furthermore, the transmit signal from one channel 20 may be output to more than one transducer element 31.

The above described channel 20 may allow for transition between CW and PW operation at logic switching rates as opposed to rates associated with adjusting a voltage supply. By using fixed supply voltages for separate amplifier stages, the system power supply requirements may be reduced. The costs may also be minimized since many of the elements of this topology, as discussed below, may be implemented on an analog integrated circuit.

Figure 2:
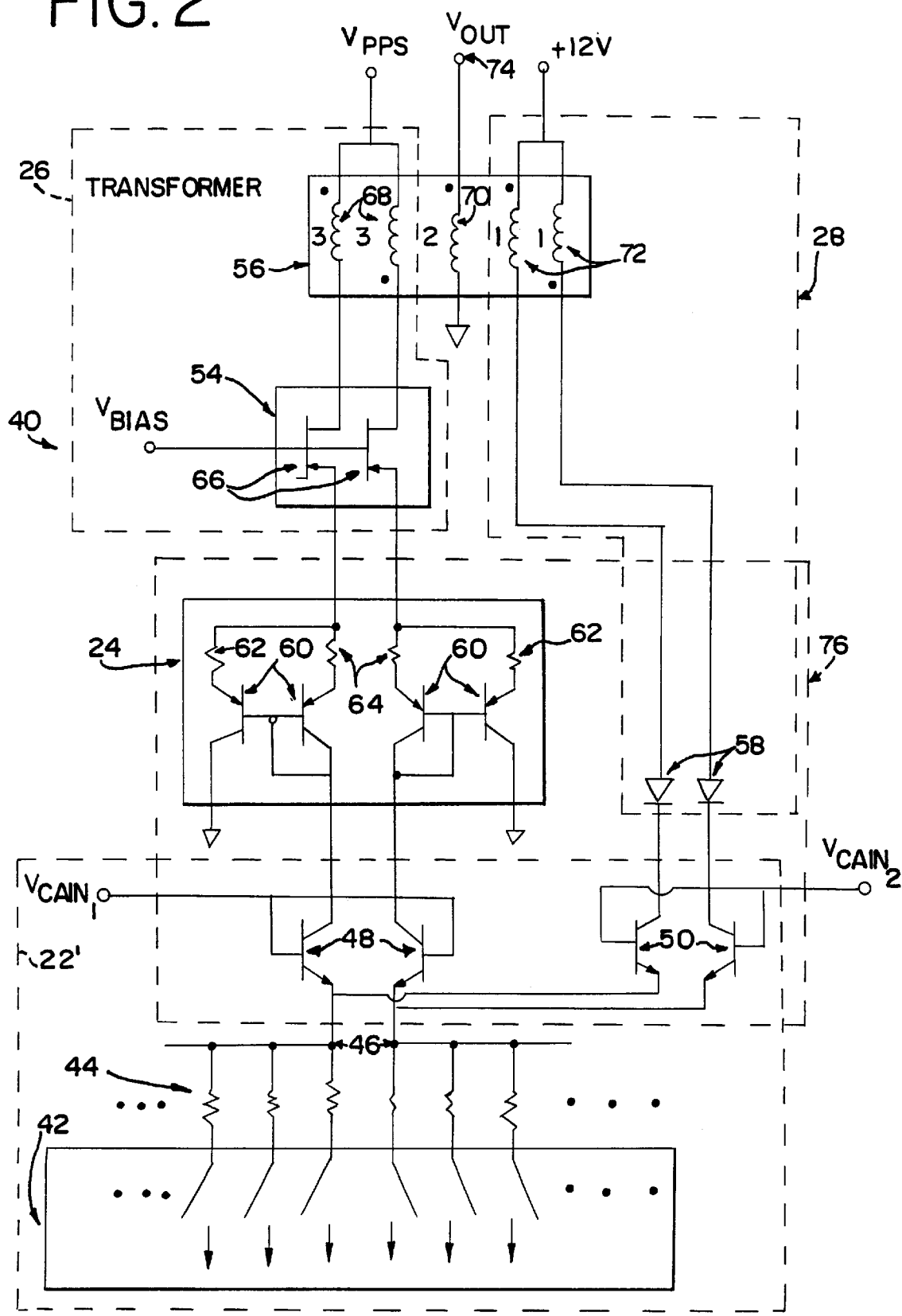
FIG. 2 is a circuit level diagram of one embodiment suitable for use in the system of FIG. 1 for amplification of transmit signals.

Referring now to FIG. 2, one embodiment of the DAC 34 and amplifier stages 24, 26, 28 for PW and CW operation is generally shown at 40. An encoder 42 connects to a plurality of resistors 44. The resistors 44 are connected in two different groupings of parallel resistors. Each grouping corresponds to a differential current output 46. The differential outputs are provided to PW and CW current setting transistors 48 and 50. The encoder 42, the resistors 44 and the PW and CW current setting transistors 48 and 50 comprise a portion 22" of the transmit signal processing circuitry 22 of FIG. 1. The PW amplifier stage includes the current amplifier 24, the output stage 54 and a portion of the transformer 56. The output stage 54 and the portion of the transformer 56 comprise the high voltage amplifier 26. The CW amplifier stage includes the diodes 58 and another portion of the transformer 56. Other structures and circuitry may be used for providing switching and separate amplifier stages.

The encoder 42 encodes the digital samples representing the transmit waveform into six thermometer code (equally weighted) most significant bits and three binary code least significant bits, and a sign bit. The coded output of the encoder 42 is provided to one of two groupings of resistors 44. One grouping is for positive values and another grouping for negative values. The sign bit is used to enable only the appropriate grouping of resistors 44. Other bit codings, such as a different combination of thermometer and binary codes or exclusively thermometer or exclusively binary coding, may be used. The coded bits turn on or allow current to pass through various ones of the resistors 44. Preferably, the resistors 44 correspond to six 100 ohm resistors associated with the thermometer coding and one 200 ohm, one 400 ohm, and one 800 ohm resistors corresponding to the binary coding. Based on the activation of a current through any of the various resistors, an output voltage and differential current are generated at the differential current output 46 (the currents are summed).

The current setting transistors 48 and 50 switch or direct the current to either the CW or PW amplifier stage and set a current level. Preferably, the PW and CW current setting transistors 48 and 50 are 50 volt 500 miliamp NPN transistors, but other transistors may be used. The switching and setting of the current level is a function of the gain voltages applied to the PW and CW current setting transistors 48, 50. For PW operation, the gain voltage of the CW current setting transistors 50 is set to 0. Little or no current passes through the CW current setting transistors 50. The current is directed to the PW current setting transistors 48. The gain voltage of the PW current setting transistors 48 is preferably set at 3 or 5 volts. Other voltage levels may be used. For lower power PW operation, the gain voltage is set to a lower voltage, such as 3 volts. For CW operation, the gain voltage of the PW current setting transistors 48 is set to 0 and the gain voltage of the CW current setting transistors 50 is set to 3 volts. Other voltage levels for the gain voltage may be used. As an alternative to the PW and CW current setting transistors 48 and 50 integral to the DAC structure, separate current setting transistors followed by current switching transistors may be used.

During PW operation, the current of the transmit signal is amplified by the current amplifier 24. The current amplifier includes the transistors 60 and associated resistors 62. Other current amplification architectures may be used. Preferably, the transistors 60 are 50 volt 500 miliamp PNP transistors, and the resistors 62 and 64 are approximately 25 and 50 ohm resistors, respectively. Other transistors and resistors may be used. The current gain is a ratio of the resistor values. Preferably, the current is amplified by a gain factor of three, such as by setting the resistors 62 as one half the value of the resistors 64. Other gain factors may be used.

Figure 5:
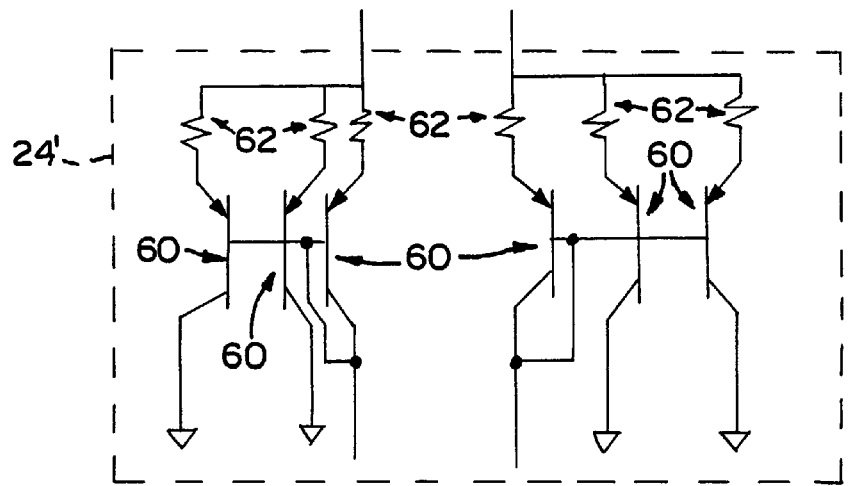
FIG. 5 is a circuit level diagram of another embodiment of a current amplifier suitable for use in the system of FIG. 1.

An alternative current amplifier 24' is shown in FIG. 5. A third transistor 60 is added in parallel with the other transistors 60. The base and the collector are connected in common with the base in collector of another of the transistors 60. A resistor 62 connects to the emitter. A gain factor of three is provided by using the same resistor value for all three resistors 62 connected to the emitters of the transistors 60. Other current amplifiers may be used.

Returning to FIG. 2, the output of the current amplifier 52 is provided to the output stage 54. The output stage 54 includes two transistors 66, such as 300 volt, 1 amp FET transistors. Other transistors may be used. A bias voltage, such as 35 volts, is applied to each of the transistors 66. The output stage 66 provides high voltage output swing.

The output from the output stage 54 is provided to the transformer 56. The transformer 56 includes PW winding 68, output windings 70, and CW windings 72. A fixed power supply connects to each of the PW winding 68, such as a 210 volt power supply. A low power supply connects to each of the CW windings 72, such as a fixed 12 volt supply. Based on the ratio of PW winding 68 to the output winding 70, an amplified signal is generated at the output 74. Preferably, a high gain or winding ratio, such as the three halves or another value, is used for PW operation. The current generated at the output 74 is a function of the sum of the currents through the PW windings 68 and the CW windings 72. Preferably, only one amplifier stage is operational at any given time, so the current through the output 74 is a function of the current of the operational amplifier stage.

Preferably, the voltage at the output 74 is capable of varying peak to peak by 160 volts (±80 volts), such as for PW operation. The minimum potential gate to drain voltage on transisters 54 is preferably 50 or more volts above the bias voltage of the output stage 54. For example, the 210 volts of the supply minus the winding ratio (3/2) multiplied by the 80 volts of the output 74 is 90 volts. 90 volts is 55 volts higher than the 35 bias voltage.

During PW operation, the voltage across the CW windings varies around the 12 volt supply voltage by the ratio (1/2) of the CW windings 72 to the output winding 70 multiplied by the output voltage. For example, the 12 volts plus or minus (1/2) 80 is 12 volts plus or minus 40 volts. Thus, the voltage may be negative. The diodes 58 prevent or block the negative voltage from disturbing the gain voltage and the CW current setting transistors 50.

For CW operation, the effective winding ratio (ratio of CW winding 72 to the output winding 70) is one half, but other winding ratios may be used. The one half winding ratio results in a reduction in current at the output 74. As an alternative, a one to one ratio is used. For a one to one ratio, the voltage supply is preferably a 20 volt voltage supply, and the current setting transistors 50 are capable of handling approximately 60 volts. Preferably, the voltage varies by ±80 about the 12 volt voltage supply.

The amplified transmit signal at the output 74 (from either the CW or PW amplifier stages) is provided to a transducer element. The amplified transmit signal may be filtered or otherwise processed prior to application to the transducer element.

Preferably, the current setting transistors 48 and 50, the diodes 58 and the current amplifier 24 are included on an integrated circuit as represented by dashed box 76. Additional or fewer components may be provided on the integrated circuit.

Figure 3:
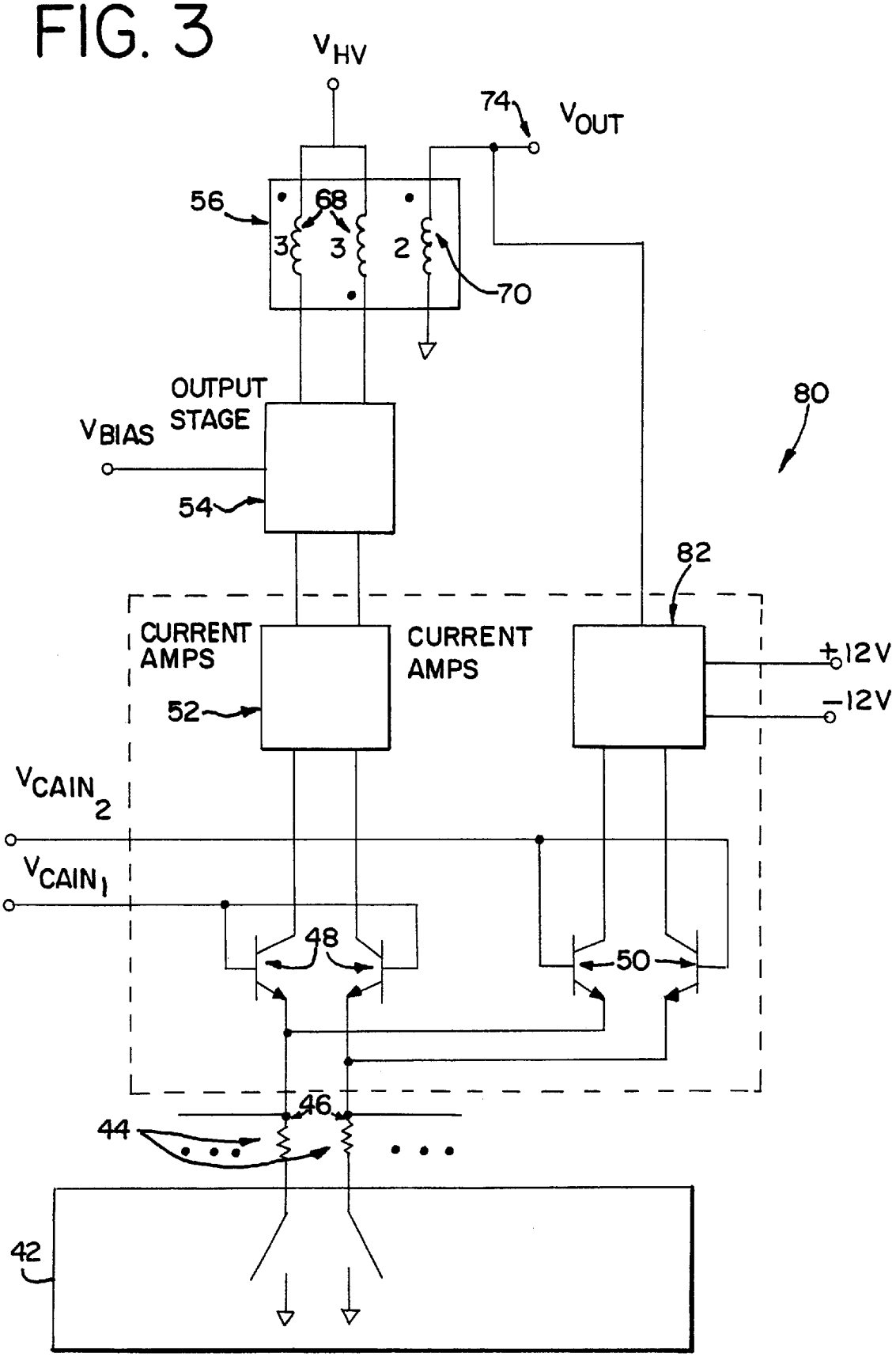
FIG. 3 is a circuit level diagram of an alternative embodiment suitable for use in the system of FIG. 1 for amplification of transmit signals.
Figure 4:
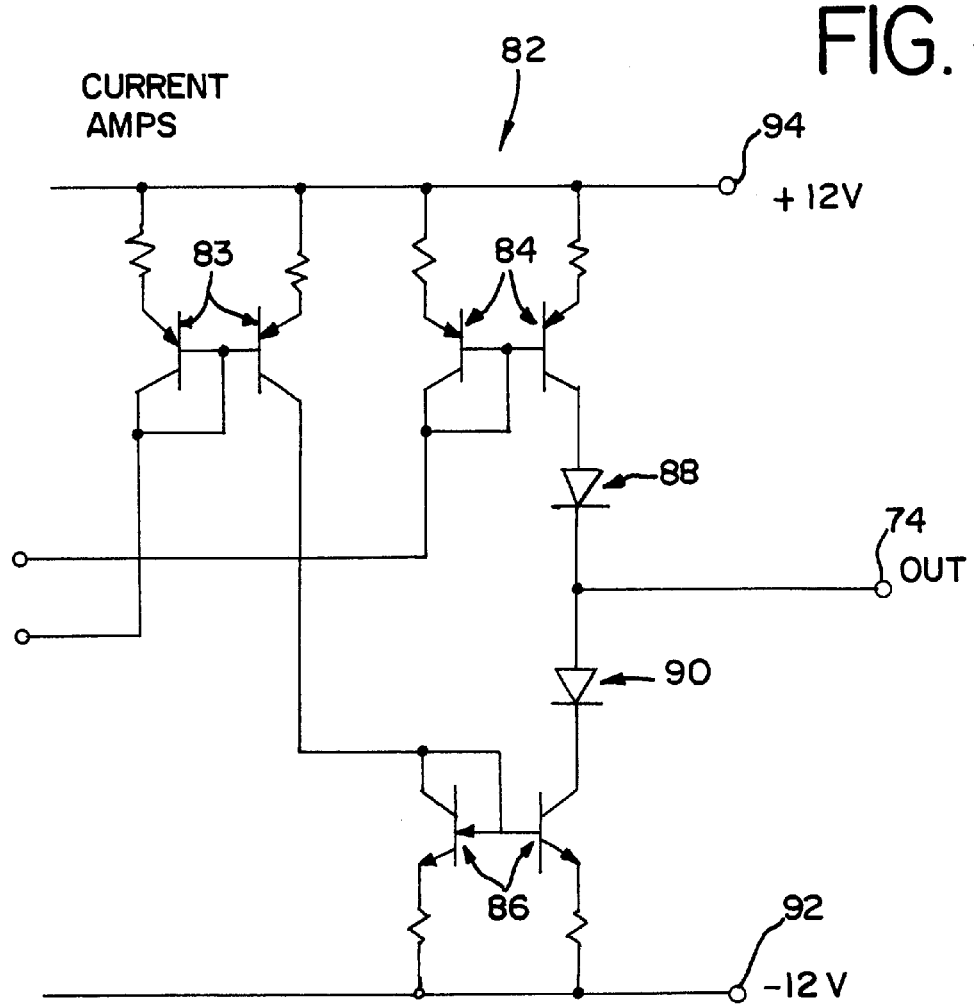
FIG. 4 is a circuit level diagram of one embodiment of a current amplifier suitable for use in the system of FIG. 1.

Referring now to FIG. 3, an alternative embodiment of the amplifier channel is generally shown at 80. For this alternative embodiment, the CW amplifier stage is not connected to the output 74 through the transformer 56. A current amplifier 82 is provided for supplying the amplified transmit signal to the output 74. Where appropriate, the same reference numerals used for FIG. 2 are used in FIG. 3. Referring to FIG. 4, a preferred embodiment of the current amplifier 82 is shown. The current amplifier 82 includes three sets of resistors and transistors 83, 84, 86, a positive 12 volt supply 94, a negative 12 volt supply 92, and two diodes 88 and 90. Preferably, high voltage diodes capable of withstanding a 100 volts in the reverse direction are used. The transistors of the sets 84 and 86 connected to the output 74 are preferably capable of withstanding the full voltage swing at the output 74 during PW operation. Preferably, the transistors 83 are 30 volt and up to 200 miliamp PNP transistors; the transistors 84 are 100 volt, 200 miliamp PNP transistors capable of withstanding 80 volts collector to base; and the transistors 86 are 100 volt, 200 miliamp NPN transistors also capable of withstanding 80 volts collector to base. Other transistors with different values may be used. Preferably, the resistors are 5 to 20 ohms, but other resistors may be used. The asymmetrical current mirroring of the current amplifier 82 increases the level of even harmonic terms. Even harmonics do not adversely affect CW operation. The diode 88 allows greater than 12 volt signals to pass to the output 74, and the diode 90 allows less than minus 12 volt signals to pass to the transistor in a set 86. The current amplifier 82 provides a high impedance. For the differential current representing the rectified positive values, the current is sourced from the 12 volt power supply 94 by the set 84 of transistors. For the negative portions of the differential current, the current is sourced from the 12 volt power supply 94 and sunk from the minus 12 volt power supply 92 through the sets 83 and 86 of transistors. Other current amplification structures may be used.

While the invention has been described above by reference to various embodiments, it will be understood that many changes and modifications can be made without departing from the scope of the invention. For example, different transistors, transistor structures, resistors, current amplifiers and volt amplifiers may be used. Furthermore, many different circuits for generating the transmit signals may be used for one or all of the various channels. The amplification stages may provide output to more than one transducer element. Additionally, the separate amplifier stages may be used for different levels of PW operation or for other modes of operation regardless of PW or CW generation.

It is therefore intended that the foregoing detailed description be understood as an illustration of the presently preferred embodiments of the invention, and not as a definition of the invention. It is only the following claims, including all equivalents, that are intended to define the scope of the invention.

What is claimed is:

1. An apparatus for amplifying an ultrasonic transmit signal, the apparatus comprising:

an ultrasonic transmit signal input;

a first amplifier stage comprising a first supply voltage input, the first amplifier stage operatively connected to the ultrasonic transmit signal input;

a second amplifier stage comprising a second supply voltage input, the second amplifier stage operatively connected to the ultrasonic transmit signal input in parallel with the first amplifier stage;

an amplified ultrasonic transmit signal output operatively connected to the first and second amplifier stages, and a transducer element operatively connected with the amplified ultrasonic transmit signal output.

2. The apparatus of claim 1 further comprising an ultrasound transmit signal processing stage operatively connected to the transmit signal input.

3. The apparatus of claim 2 wherein the processing stage comprises a digital to analog converter.

4. The apparatus of claim 1 wherein the transmit signal input comprises first and second differential current inputs.

5. The apparatus of claim 1 wherein the first supply voltage input is associated with a lower voltage than the second supply voltage input.

6. The apparatus of claim 5 wherein the first and second supply voltage inputs comprise fixed voltage inputs.

7. The apparatus of claim 1 wherein the processing stage further comprises first and second current gain inputs, respectively, wherein the first and second current gain inputs are operable to switch between a zero voltage level and a gain voltage.

8. The apparatus of claim 7 wherein the first and second current gain inputs are operable to direct current to substantially one of the first and second amplifier stages.

9. The apparatus of claim 1 wherein the first amplifier stage is associated with continuous wave transmit signals and the second amplifier stage is associated with pulse wave transmit signals.

10. The apparatus of claim 1 wherein the first and second amplifier stages comprise a transformer.

11. The apparatus of claim 1 wherein the second amplifier stage further comprises a current amplifier.

12. The apparatus of claim 11 wherein the first amplifier stage further comprises a current amplifier.

13. The apparatus of claim 11 wherein the first amplifier stage further comprises at least one diode.

14. The apparatus of claim 1 wherein said apparatus comprises one channel and wherein a plurality of channels operatively connect to a transducer.

15. A method for amplifying an ultrasonic transmit signal, the method comprising the steps of:
  (a) supplying a first voltage to a first voltage amplifier;
  (b) supplying a second voltage to a second voltage amplifier, the second voltage greater than the first voltage;
  (c) performing one of two steps, the two steps comprising:
    (i) amplifying pulse wave ultrasonic transmit signals with the second voltage amplifier; and
    (ii) amplifying continuous wave ultrasonic transmit signals with the first voltage amplifier; and
  (d) providing output signals responsive to step (c) to a transducer element.

16. The method of claim 15 further comprising the step (e) of providing transmit signals selected from the group consisting of: pulse wave and continuous wave signals.

17. The method of claim 16 wherein step (e) comprises the step of providing first and second differential current input signals.

18. The method of claim 15 wherein steps (a) and (b) comprise the steps of supplying the first and second voltages as fixed voltages.

19. The method of claim 15 further comprising the step (e) of switching between (i) and (ii) in response to first and second gain voltage signals.

20. The method of claim 19 wherein step (e) comprises the step of directing current to substantially one of the first and second voltage amplifiers.

21. The method of claim 15 wherein:
  steps (a) and (b) comprise the steps of supplying the first and second voltages to at least first and second windings of a transformer; and
  step (c) comprises the step of transforming transmit signals to output transmit signals.

22. The method of claim 15 wherein step (c)(i) comprises the step of amplifying a current of the pulse wave signals.

23. The method of claim 22 wherein step (c)(ii) comprises the step of amplifying a current of the continuous wave signals.

24. The method of claim 22 further comprising the step (e) of blocking a current in the first voltage amplifier with at least one diode and performing the step (c)(i).

25. An apparatus for amplifying an ultrasonic transmit signal, the apparatus comprising:
  an amplified transmit signal output;
  an ultrasonic transmit pulse wave voltage amplifier operatively connected to the output; and
  an ultrasonic transmit continuous wave voltage amplifier operatively connected to the output in parallel with the pulse wave voltage amplifier.

26. The apparatus of claim 25 further comprising current setting transistors comprising gain inputs, wherein the gain inputs are operable to route current to one of the pulse and continuous wave voltage amplifiers.

27. The apparatus of claim 25 wherein:
  the pulse wave voltage amplifier comprises a first fixed supply voltage; and
  the continuous wave voltage amplifier comprises a second fixed supply voltage, the second fixed supply voltage less than the first fixed supply voltage.

* * * * *